(12) United States Patent
Kim et al.

(10) Patent No.: US 7,557,030 B2
(45) Date of Patent: Jul. 7, 2009

(54) METHOD FOR FABRICATING A RECESS GATE IN A SEMICONDUCTOR DEVICE

(75) Inventors: Seung-Bum Kim, Ichon-shi (KR);
Ki-Won Nam, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 208 days.

(21) Appl. No.: 11/594,072

(22) Filed: Nov. 8, 2006

(65) Prior Publication Data

US 2008/0044992 A1    Feb. 21, 2008

(30) Foreign Application Priority Data

Aug. 21, 2006    (KR) .................... 10-2006-0078945

(51) Int. Cl.
*H01L 21/20* (2006.01)
(52) U.S. Cl. ............ 438/618; 438/624; 438/626; 438/637; 438/678; 438/769; 257/E21.507; 257/E21.576; 257/E21.584; 257/E21.589; 257/E21.592; 257/E23.162; 257/E23.167
(58) Field of Classification Search ........... 438/622, 438/623, 637, 677, 704, 706, 710, 714, 722, 438/723, 756, 618, 624, 626, 678, 687, 754, 438/769, 725, 791, 792; 257/E21.226, 252, 257/311, 577–579, 582, E21.507, 576, 583–585, 257/589, 592, E23.162, 167
See application file for complete search history.

(56) References Cited

U.S. PATENT DOCUMENTS

| | | | | |
|---|---|---|---|---|
| 5,851,302 A | * | 12/1998 | Solis | 134/1.2 |
| 6,001,736 A | * | 12/1999 | Kondo et al. | 438/677 |
| 6,090,699 A | * | 7/2000 | Aoyama et al. | 438/622 |
| 6,169,036 B1 | * | 1/2001 | Bhowmik et al. | 438/710 |
| 6,232,219 B1 | * | 5/2001 | Blalock et al. | 438/637 |
| 6,475,909 B2 | * | 11/2002 | Uozumi | 438/678 |
| 6,534,397 B1 | * | 3/2003 | Okada et al. | 438/633 |
| 6,583,046 B1 | * | 6/2003 | Okada et al. | 438/622 |
| 6,613,681 B1 | * | 9/2003 | Hillyer et al. | 438/704 |
| 6,649,531 B2 | * | 11/2003 | Cote et al. | 438/714 |
| 6,667,246 B2 | * | 12/2003 | Mitsuhashi et al. | 438/756 |

(Continued)

FOREIGN PATENT DOCUMENTS

CN    1815697    8/2006

(Continued)

OTHER PUBLICATIONS

Notice of Preliminary Rejection from the Korean Intellectual Property Office, mailed Jul. 27, 2007, in Korean Patent Application No. 2006-0078945 and English translation thereof.

(Continued)

*Primary Examiner*—Michael S Lebentritt
(74) *Attorney, Agent, or Firm*—Finnegan, Henderson, Farabow, Garrett, & Dunner, L.L.P.

(57) ABSTRACT

A method for fabricating a recess gate in a semiconductor device is provided. The method includes selectively etching an active region of a substrate to form a recess pattern, performing a post treatment on the recess pattern using a plasma, and forming a gate pattern in the recess pattern.

14 Claims, 6 Drawing Sheets

U.S. PATENT DOCUMENTS

| | | | |
|---|---|---|---|
| 7,022,612 B2 * | 4/2006 | Hillyer et al. | 438/706 |
| 2004/0235253 A1 | 11/2004 | Kim | |
| 2005/0064700 A1 * | 3/2005 | Uozumi | 438/626 |
| 2005/0070086 A1 * | 3/2005 | Isono | 438/618 |
| 2005/0118817 A1 * | 6/2005 | Fujita et al. | 438/689 |

FOREIGN PATENT DOCUMENTS

| | | | |
|---|---|---|---|
| KR | 10-2005-0043408 A | | 5/2005 |
| KR | 2006/065965 | * | 4/2006 |
| KR | 10-2006-0075965 A | | 7/2006 |

OTHER PUBLICATIONS

English translation of the First Office Action issued from the State Intellectual Property Office of the People's Republic of China on Jul. 18, 2008, in a related Chinese patent application No. 200610145186.5.

* cited by examiner

HORN

V-SHAPE

V-SHAPE — HORN

U-SHAPE — HORN

METHOD FOR FABRICATING A RECESS GATE IN A SEMICONDUCTOR DEVICE

RELATED APPLICATION

This application is based upon and claims the benefit of priority to Korean patent application No. KR 2006-78945, filed in the Korean Patent Office on Aug. 21, 2006, the entire contents of which are herein incorporated by reference in their entirety.

TECHNICAL FIELD

The present invention relates to a method for fabricating a semiconductor device, and more particularly, to a method for fabricating a cell in a semiconductor device.

DESCRIPTION OF THE RELATED ART

Conventional planar cell structures are no longer able to maintain an adequate refresh time, and current methods of fabricating semiconductor devices are thus using planar cell structures in devices having high integration. Specifically, as the size of a device has decreased, the planar cell structure is not able to maintain a sufficient gate channel length.

In order to overcome the shortcomings of the conventional planar cell structure, gates have been formed in recesses formed in an active region of a semiconductor substrate to produce a gate having a greater channel length. Such gates are referred to as recess gates.

Figure 1A:
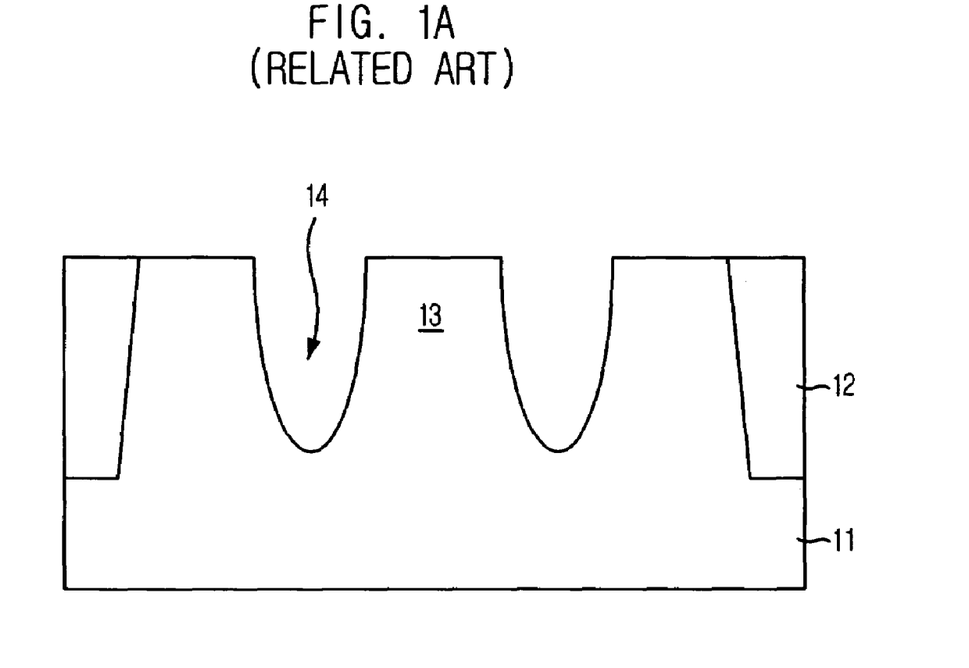
FIG. 1A illustrates a cross-sectional view to describe a method for fabricating a typical recess gate.

FIG. 1A illustrates a cross-sectional view to describe a method for fabricating a typical recess gate. Device isolation structures 12 are formed in a substrate 11, which may include silicon, and define an active region 13.

A recess gate etching process is performed to form a recess pattern 14 in active region 13. The recess gate etching process etches active region 13, which may include silicon, at a high rate, and etches device isolation structures 12, which may include oxide, at a low rate. By performing this etching process, active region 13 is exclusively etched.

Figure 1B:
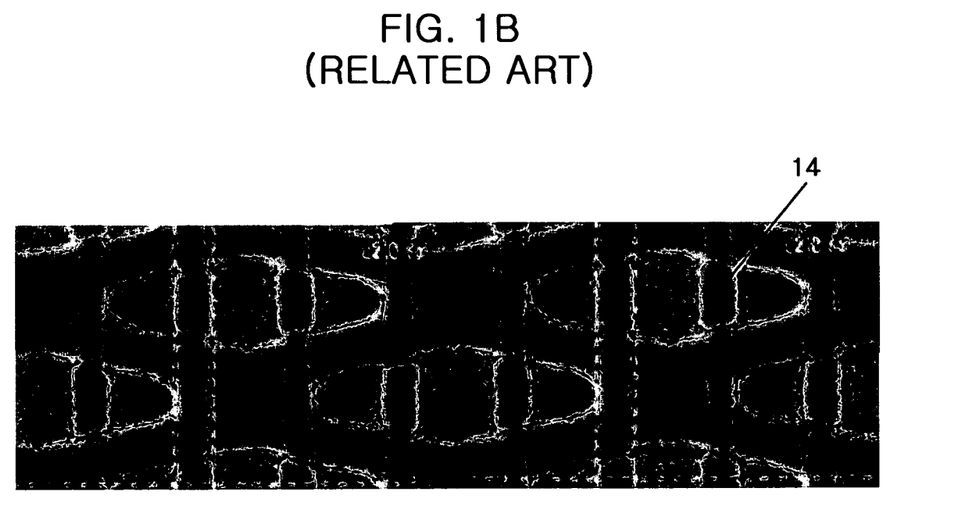
FIG. 1B illustrates a micrographic view of typical recess patterns.

FIG. 1B illustrates a micrographic view of recess patterns 14. The typical recess patterns 14 have a very sharp profile, making it difficult to reduce leakage current between adjacent cells.

Figure 2:
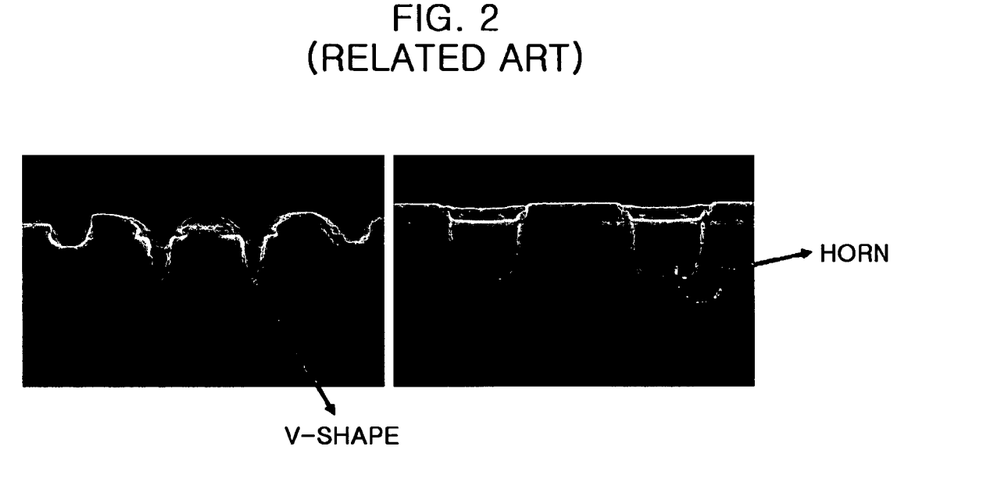
FIG. 2 illustrates micrographic views of a profile of a typical recess pattern and horns formed in the recess pattern.

FIG. 2 illustrates micrographic views of a profile of a recess pattern and horns formed in the recess pattern. The recess pattern has sharp V-shaped bottom portions, and the horns have a very high height.

In order to minimize the amount of leakage current, it is necessary to minimize the size of the horns generated at boundary regions between the active region and the device isolation structures.

BRIEF SUMMARY

Consistent with the present invention, there is provided a method for fabricating a recess gate in a semiconductor device, which can reduce leakage current by minimizing the size of horns generated during a formation of a recess pattern.

In accordance with an aspect of the present invention, there is provided a method for fabricating a recess gate in a semiconductor device, including: selectively etching an active region of a substrate to form a recess pattern; performing a post treatment on the recess pattern using a plasma; and forming a gate pattern in the recess pattern.

BRIEF DESCRIPTION OF THE DRAWINGS

The above features of the present invention will become better understood with respect to the following description of the exemplary embodiments given in conjunction with the accompanying drawings, in which.

DETAILED DESCRIPTION

A method for fabricating a recess gate in a semiconductor device in accordance with various embodiments of the present invention will be described in detail with reference to the accompanying drawings. Furthermore, same or like reference numerals through out the various embodiments of the present invention represent same or like elements in different drawings.

FIGS. 3A to 3D illustrate cross-sectional views to describe a method for fabricating a recess gate consistent with an embodiment of the present invention. A portion of the cross-sectional views in accordance with a line A-A' refers to a cross-sectional view in a direction along a major axis of an active region, and another portion of the cross-sectional views in accordance with a line B-B' refers to a cross-sectional view in a direction along a minor axis of the active region.

Figure 3A:
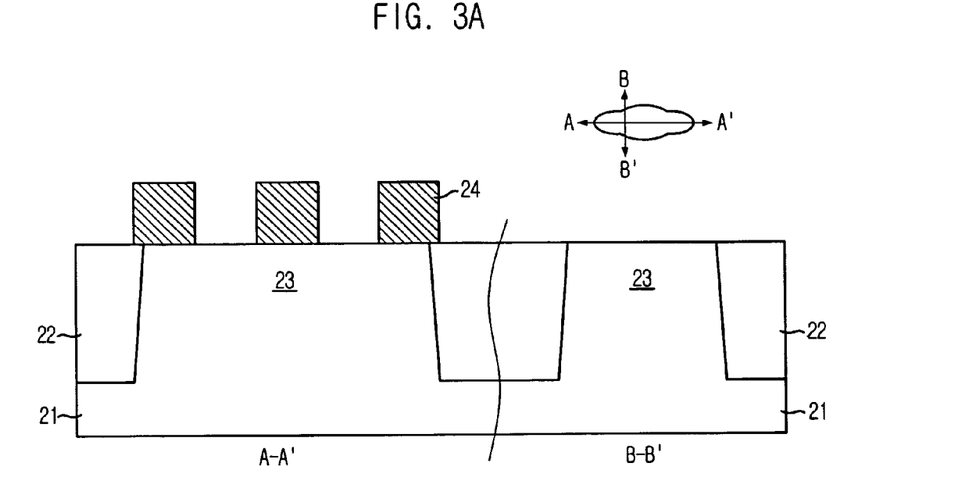
FIGS. 3A to 3D illustrate cross-sectional views to describe a method for fabricating a recess gate consistent with an embodiment of this invention.

Referring to FIG. 3A, a shallow trench isolation (STI) process is performed on a substrate 21, which may include silicon, to form device isolation structures 22 in a trench. Device isolation structures 22 define an active region 23, and may include a high density plasma oxide.

An etch barrier pattern 24 for use in a recess gate etch process is formed over a portion of substrate 21. Etch barrier pattern 24 may include a single pattern comprising one of oxide and polysilicon, or a stacked pattern comprising oxide and polysilicon. Etch barrier pattern 24 is formed in a line type, exposing portions of active region 23 where subsequent recess patterns are to be formed.

Figure 3B:
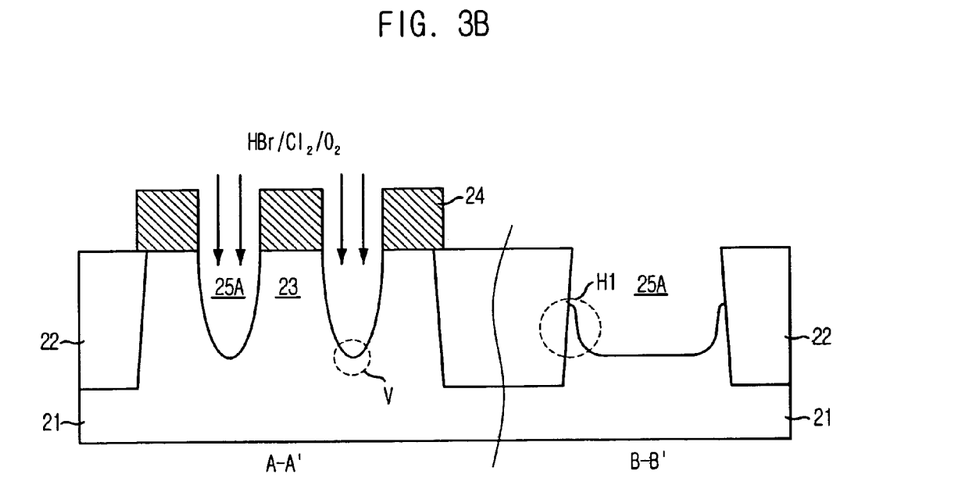

Referring to FIG. 3B, the recess gate etch process is performed using etch barrier pattern 24 as an etch barrier. The recess gate etch process forms a recess pattern 25A having a predetermined depth in active region 23. Although not illustrated, portions of etch barrier pattern 24 and portions of device isolation structures 22 adjacent to the regions where recess pattern 25A is formed may be removed during the recess gate etch process.

The recess gate etch process selectively etches active region 23 by etching active region 23, which may include silicon, at a higher rate than device isolation structures 22, which includes a high density plasma oxide layer, are etched. The recess gate etch process may be performed using an etch gas mixture including hydrogen bromide (HBr), chloride ($Cl_2$), and oxygen ($O_2$), while maintaining an adequate flow rate ratio of the etch gas mixture.

For instance, in an example consistent with the present invention, the recess gate etch process may be performed under the following conditions: a chamber pressure of approximately 30 mTorr or less, i.e., ranging from approximately 2 mTorr to approximately 30 mTorr; a flow rate ratio of a gas mixture including HBr and $Cl_2$ to $O_2$ in the etch gas mixture at approximately 20:1 or higher, i.e., ranging approximately 20-30:1; a flow rate ratio of HBr to $Cl_2$ in the etch gas mixture at approximately 2:1 or higher, i.e., ranging approximately 2-5:1; a source power of approximately 1,000 W or higher, i.e., ranging from approximately 1,000 W to approximately 2,000 W; and a bias power of approximately 500 W or less, i.e., ranging from approximately 100 W to approximately 500 W.

Referring to the above conditions, using the flow rate ratio of the gas mixture including HBr and $Cl_2$ to $O_2$ at approximately 20:1 or higher, i.e., ranging approximately 20-30:1, allows active region 23 to be etched at a relatively high rate. This is because active region 23 is primarily etched by the HBr gas, so having a flow rate ratio of HBr to $Cl_2$ at approximately 2:1 or higher, i.e., ranging approximately 2-5:1, results in active region 23 being etched at a relatively high rate.

However, as active region 23 is etched under the above conditions, recess pattern 25A that is formed by etching gradually obtains a sharp profile, denoted 'V', having sidewalls increasingly sloped toward bottom portions of recess pattern 25A.

Moreover, recess pattern 25A formed by the recess gate etch process often inevitably generates prominent horns at boundary regions between recess pattern 25A and device isolation structures 22 as denoted with reference denotation 'H1'. The prominent horns are vulnerable to a leakage current.

Figure 3C:
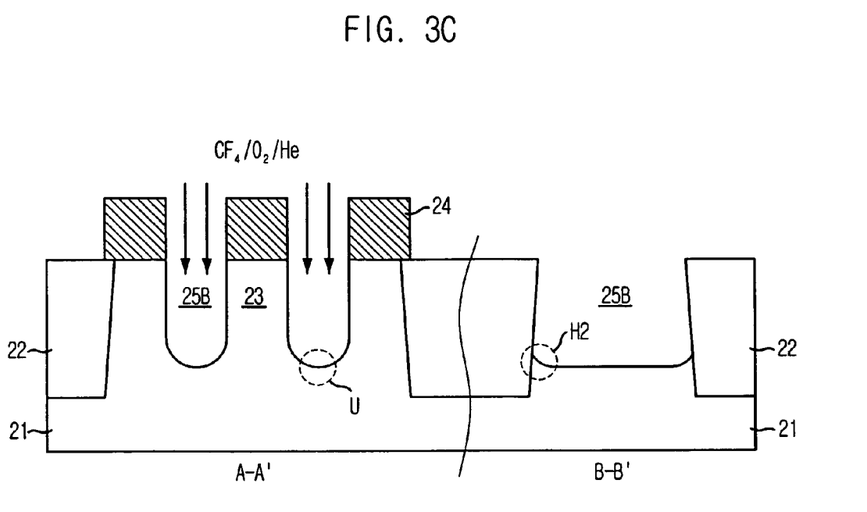

Accordingly, this embodiment performs a post treatment as illustrated in FIG. 3C to ease the sharpness of the profile of recess pattern 25A and minimize the height of horns H1.

Referring to FIG. 3C, the post treatment is performed in-situ in the same chamber used for the recess gate etch process. The post treatment maintains a chamber pressure ranging from approximately 2 mTorr to approximately 30 mTorr. Unlike the conditions of the recess gate etch process, the post treatment uses an etchant including a gas mixture comprising a fluorine-based gas, $O_2$ gas, and helium (He) gas. The fluorine-based gas supplies fluorine (F) radicals, and He gas is an inert gas. Consistent with the present invention, the fluorine-based gas may include one selected from a group consisting of tetrafluoromethane ($CF_4$), sulfur hexafluoride ($SF_6$), fluoroform ($CHF_3$), and a combination thereof. In one embodiment consistent with the present invention, a mixture including $CF_4$, $O_2$, and He is used. A source power ranging from approximately 500 W to approximately 2,000 W is used. A bias power is either not used, i.e., 0 W, or a bias power of approximately 100 W or less, i.e., ranging from approximately 1 W to approximately 100 W, is used.

Unlike the recess gate etch process which deepens the depth of recess pattern 25A, the post treatment transforms the sharply formed bottom portions of recess pattern 25A (refer to reference letter 'V' shown in FIG. 3B) into a rounded shape with a flat bottom surface (refer to reference letter 'U' shown in FIG. 3C). Accordingly, the post treatment minimizes the bias power and uses the etchant including the fluorine-based gas supplying F radicals, and the radicals serve as the primary catalyst in inducing chemical reactions.

Using the minimized bias power and the fluorine-based gas allows only the F radicals to etch recess pattern 25A. Consequently, the bottom portions of recess pattern 25A transform from the sharp profile ('V' shown in FIG. 3B) into the rounded profile having the flat bottom surface ('U' shown in FIG. 3C.) The rounded profile eliminates the sharp edges, and increases the overall surface area in recess pattern 25A. For instance, when $CF_4$ is used as the fluorine-based gas, the plasma composing elements may include electrons, $CF_4$, $CF_x$, where x representing an atomic ratio of F ranges from approximately 1 to approximately 3, F, and trifluoromethyl radicals ($CF_3^+$). Only the radicals having very strong reactivity, such as $CF_3$ and F, etch recess pattern 25A. Furthermore, when the use of the bias power is minimized, the F radicals do not concentrate at the bottom of recess pattern 25A, but the chemical etching by the F radicals mainly occurs at the sidewalls of recess pattern 25A. Thus, an isotropic etching is intensified to transform the shape of the bottom portion of recess pattern 25A into the rounded shape with the flat bottom surface. Using the minimized bias power allows reducing ion energy, and consequently, etching by ions having straightness composing the plasma is reduced.

Thus, as the profile of the bottom portion of recess pattern 25A transforms into the rounded profile with the flat bottom surface, the height of the horns is also reduced as shown with reference denotation 'H2' representing a height of approximately 100 Å or less. Hereinafter, recess pattern 25A after the post treatment is referred to as a rounded recess pattern 25B.

Figure 3D:
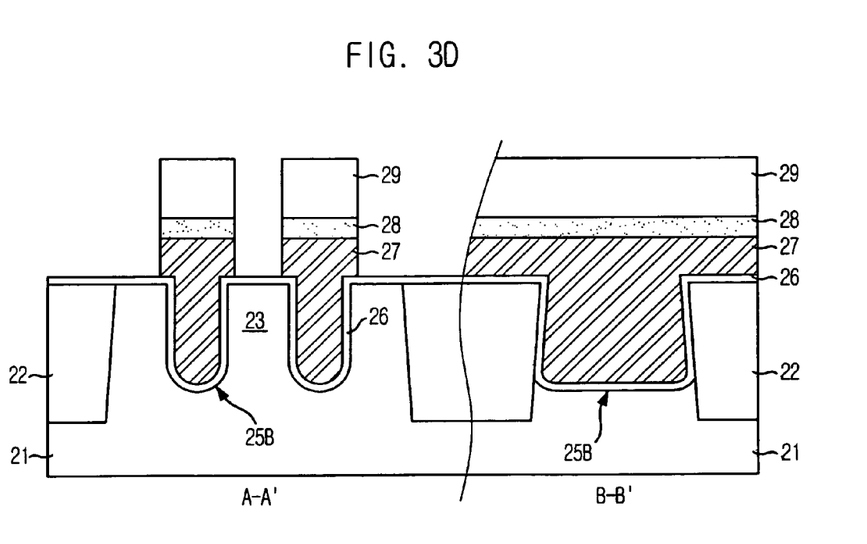

Referring to FIG. 3D, etch barrier pattern 24 is removed. A light etch treatment (LET) may be performed to round top corners of rounded recess pattern 25B. Rounding the top corners of rounded recess pattern 25B removes a stress point that may cause a leakage current, and thus, improves a refresh characteristic. Consistent with the present invention, the LET may include a dry etching process using a gas mixture including $CF_4$ and $O_2$.

A gate insulation layer 26 is then formed over the resulting substrate structure and in rounded recess pattern 25B. Recess gates are formed on gate insulation layer 26 and are filled in rounded recess pattern 25B. Each recess gate includes a patterned polysilicon layer 27, a patterned tungsten silicide (WSi) layer 28, and a gate hard mask 29. In more detail, a polysilicon layer is formed over gate insulation layer 26 and filled in rounded recess pattern 25B. A WSi layer and a gate hard mask layer are then formed over the polysilicon layer. Gate hard mask layer 29 may include a nitride-based layer. A gate patterning process is then performed thereon to form the recess gates such that patterned polysilicon layers 27 are filled in recess pattern 25B. A portion of the patterned polysilicon layers 27 formed over device isolation structure 22 is approximately 1/5 of a thickness of another portion of patterned polysilicon layers 27 formed in active region 23.

Figure 4:
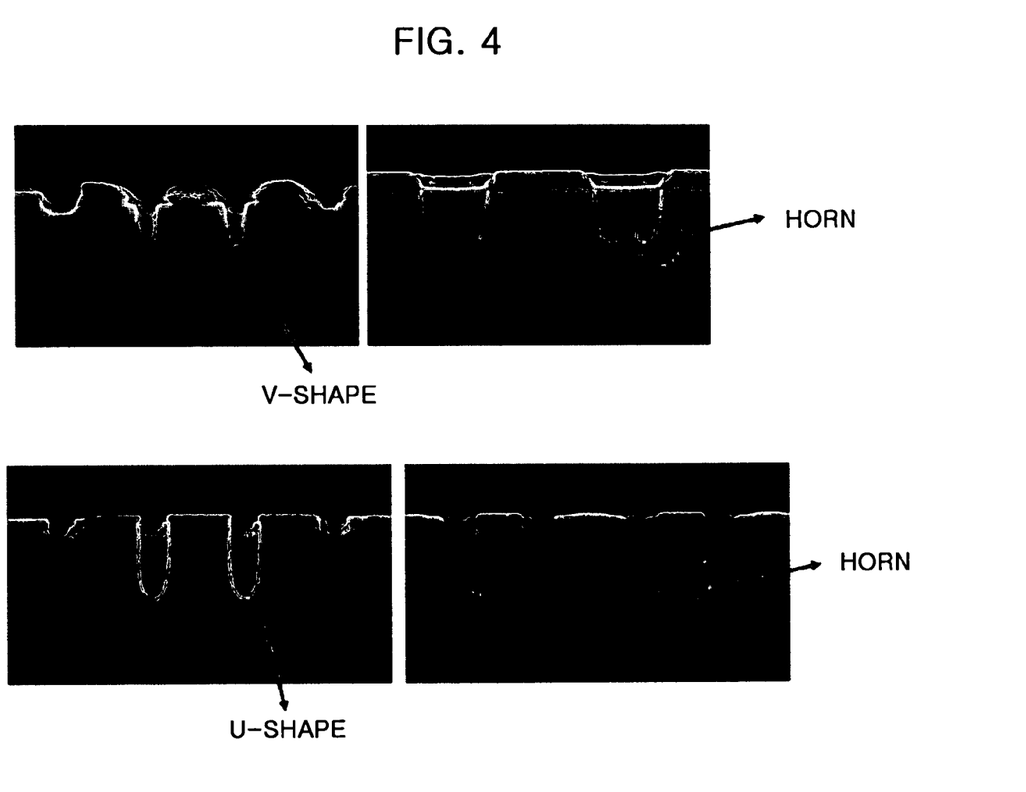
FIG. 4 illustrates micrographic views to describe a reduced height of horns consistent with an embodiment of this invention.

FIG. 4 illustrates micrographic views illustrating the reduced height of horns consistent with an embodiment of this invention in comparison with typical horns. The height of the horns formed with a U-shaped recess pattern consistent with this embodiment is much lower than that of the typical horns formed with the typical V-shaped recess pattern. Different from a sharp profile of the typical V-shaped recess pattern, a profile of the U-shaped recess pattern consistent with this embodiment is rounded and obtains a flat bottom surface.

This embodiment can be applied to a method for fabricating a semiconductor device including an etching process of a silicon substrate. For instance, this embodiment can be applied to an etching of a silicon substrate to form a trench where a device isolation structure is to be filled into.

Consistent with this embodiment, a three-dimensional recess gate with reduced leakage current generation can be applied in a cell of a highly integrated dynamic random access memory (DRAM) under 80 nm by transforming the sharp profile of the recess pattern into the rounded profile with the flat bottom surface and simultaneously minimizing the height of the horns using the F radicals during the post treatment.

While the present invention has been described with respect to certain specific embodiments, it will be apparent to those skilled in the art that various changes and modifications may be made without departing from the spirit and scope of the invention as defined in the following claims.

What is claimed is:

1. A method for fabricating a recess gate in a semiconductor device, comprising:
   selectively etching an active region of a substrate to form a recess pattern;
   performing a post treatment on the recess pattern to round the recess pattern using a plasma of a gas mixture, such that the recess pattern has a flat bottom surface; and
   forming a gate pattern in the recess pattern.

2. The method of claim 1, wherein performing the post treatment comprises using a plasma of a gas mixture including a fluorine-based gas.

3. The method of claim 2, wherein the gas mixture comprises the fluorine-based gas, an oxygen ($O_2$) gas, and an inert gas.

4. The method of claim 3, wherein the fluorine-based gas comprises a gas selected from a group consisting of tetrafluromethane ($CF_4$), sulfur hexfluoride ($SF_6$), fluoroform (CHF3), and a combination thereof.

5. The method of claim 3, wherein the inert gas comprises helium (He) gas.

6. The method of claim 1, wherein performing the post treatment comprises performing the post treatment in a chamber at a pressure ranging from approximately 2 mTorr to approximately 30 mTorr.

7. The method of claim 6, wherein performing the post treatment comprises providing a power source ranging from approximately 500 W to approximately 2,000 W.

8. The method of claim 6, wherein performing the post treatment comprises providing a power source ranging from approximately 500 W to approximately 2,000 W and a bias power of approximately 100 W or less.

9. The method of claim 8, wherein forming the recess pattern and performing the post treatment are performed in the same chamber in-situ.

10. The method of claim 9, wherein forming the recess pattern comprises using a gas mixture including hydrogen bromide (HBr), chrloride ($Cl_2$), and $O_2$.

11. The method of claim 10, wherein the gas mixture comprises a ratio of a flow rate of a gas mixture comprising HBr and $Cl_2$ to a flow rate of $O_2$ which is approximately 20:1 or greater.

12. The method of claim 11, wherein a ratio of a flow rate of HBr to a flow rate of $Cl_2$ is approximately 2:1 or greater.

13. The method of claim 9, wherein forming the recess pattern comprises forming the recess pattern in a chamber at a pressure of approximately 30 mTorr or less.

14. The method of claim 1, wherein performing the post treatment comprises using a plasma including fluorine (F) radicals.

* * * * *